United States Patent
Liu et al.

(10) Patent No.: US 10,782,830 B2
(45) Date of Patent: Sep. 22, 2020

(54) FLEXIBLE TOUCH SENSOR AND FLEXIBLE TOUCH DISPLAY PANEL

(71) Applicant: WUHAN TIANMA MICRO-ELECTRONICS CO., LTD., Wuhan (CN)

(72) Inventors: Xuening Liu, Wuhan (CN); Qing Zhang, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 88 days.

(21) Appl. No.: 15/868,743

(22) Filed: Jan. 11, 2018

(65) Prior Publication Data
US 2019/0064958 A1     Feb. 28, 2019

(30) Foreign Application Priority Data
Aug. 22, 2017   (CN) .......................... 2017 1 0723487

(51) Int. Cl.
G06F 3/044      (2006.01)
G06F 3/041      (2006.01)
H01L 27/32      (2006.01)

(52) U.S. Cl.
CPC ............ G06F 3/044 (2013.01); G06F 3/0412 (2013.01); *G06F 2203/04102* (2013.01);
(Continued)

(58) Field of Classification Search
CPC ..................... G06F 3/044; G06F 3/047; G06F 2203/04111; G06F 2203/04104;
(Continued)

(56) References Cited

U.S. PATENT DOCUMENTS

| | | | |
|---|---|---|---|
| 2014/0254111 A1* | 9/2014 | Yamazaki | ........... H01L 51/0097 |
| | | | 361/749 |
| 2015/0241924 A1* | 8/2015 | Chang | ..................... G06F 3/044 |
| | | | 349/12 |

(Continued)

FOREIGN PATENT DOCUMENTS

| CN | 104881161 A | 9/2015 |
|---|---|---|
| CN | 104934438 A | 9/2015 |
| CN | 205609529 U | 9/2016 |

OTHER PUBLICATIONS

Chinese Office Action dated Nov. 25, 2019.

*Primary Examiner* — Jimmy H Nguyen
(74) *Attorney, Agent, or Firm* — Alston & Bird LLP

(57) ABSTRACT

Provided is a flexible touch sensor having a foldable area and a non-foldable area, including: first touch electrodes placed in the non-foldable area; second touch electrodes; a third touch electrode placed in the foldable area, the third touch electrode not overlapping a portion of the second touch electrode in the foldable area; and an insulation layer placed in the non-foldable area and insulated from the second touch electrodes by the insulation layer. Further provided is a flexible touch display panel including the flexible touch sensor. The above solution thins the stacked film layers in the foldable area; further, the foldable area has no insulation layer that easily cracks, so that bending stability of the foldable area is improved, and the flexible touch sensor can still have good touch performance even after repeatedly bending.

14 Claims, 7 Drawing Sheets

(52) U.S. Cl.
CPC .............. *G06F 2203/04104* (2013.01); *G06F 2203/04111* (2013.01); *H01L 27/323* (2013.01); *H01L 27/3244* (2013.01); *H01L 2251/5338* (2013.01)

(58) Field of Classification Search
CPC ......... G06F 2203/04102; H01L 27/323; H01L 27/3244; H01L 2251/5338
See application file for complete search history.

(56) References Cited

U.S. PATENT DOCUMENTS

| | | | |
|---|---|---|---|
| 2015/0311260 A1* | 10/2015 | Senda | H01L 51/5253 257/40 |
| 2016/0282992 A1* | 9/2016 | Song | G06F 3/044 |
| 2018/0040638 A1* | 2/2018 | Wu | H01L 27/1214 |

* cited by examiner

FLEXIBLE TOUCH SENSOR AND FLEXIBLE TOUCH DISPLAY PANEL

CROSS-REFERENCE TO RELATED APPLICATIONS

The present application claims priority to Chinese Patent Application No. CN201710723487.X, filed on Aug. 22, 2017, the content of which is incorporated herein by reference in its entirety.

TECHNICAL FIELD

The present invention relates to the display field and, particularly, relates to a flexible touch sensor and a flexible touch display panel.

BACKGROUND

At present, the touch screen, as an input vehicle, is one of the simplest, most convenient, and most natural man-machine interaction methods. A display device integrated with touch function has become a research and development hotspot of more and more flat display manufacturers.

With the development of the flexible display techniques, the flexible display panel with touch function is widely developed and used. Since the flexible display panel is capable of bending, folding and even rolling, it is required that the touch sensor is flexible. However, when the flexible touch sensor of the prior art is bending, folding or rolling, film layer cracks, fractures and splitting readily occur in the foldable area, resulting in touch failure of the touch sensor.

SUMMARY

The present invention provides a flexible touch sensor and a flexible touch display panel, which have good tolerance of bending and good touch stability during bending or rolling.

One aspect of the present invention provides a flexible touch sensor, including: a foldable area and a non-foldable area; a plurality of first touch electrodes placed in the non-foldable area, extending along a first direction; a plurality of second touch electrodes, a part of which is placed in the foldable area, the remaining part of which is placed in the non-foldable area, extending along a second direction, wherein the first direction intersects with the second direction; a plurality of third touch electrodes placed in the foldable area, not overlapping the part of the plurality of second touch electrodes displaced in the foldable area; and an insulation layer placed in the non-foldable area, wherein the plurality of first touch electrodes are insulated from the plurality of second touch electrodes by the insulation layer.

Another aspect of the present invention provides a flexible touch display panel, including the flexible touch sensor as described above.

DESCRIPTION OF EMBODIMENTS

Figure 1:
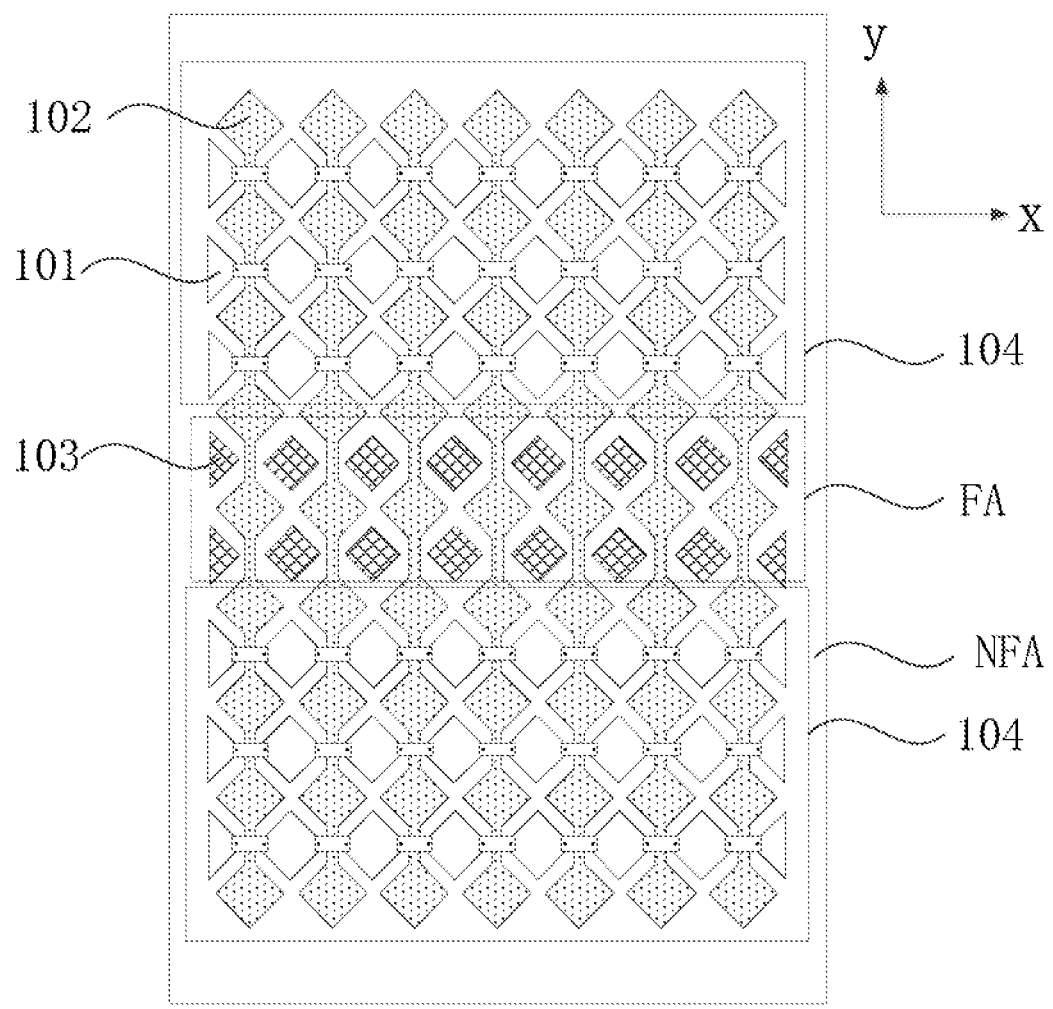
FIG. 1 illustrates a schematic diagram of a flexible touch sensor according to an embodiment of the present invention.

Because the techniques described below include a variety of changes and a plurality of implementations, the implementations will be shown in the drawings and described in detail in the written description. The effects and features of the techniques described will be fully described with reference to the drawings which show the exemplary implementations. However, the techniques described can be implemented in many different manners and should not be interpreted therefore limited to the implementations as described in this context.

A same or corresponding component in different figures uses a same reference sign. In this specification, the words "first", "second" and the like can be used to describe various components, and these components are not restricted to the above words. The above words are merely used to separate a component from another component.

In the text of the specification, "including" or "include" used to indicate the presence of the features and/or components described in the specification, inclusive of one or more other features and/or one or more other components. When it is described that a layer, an area, or a component is placed "on" another layer, another area or another component, it should be interpreted that the layer, the area, or the component can be directly placed on the another layer, the another area or the another component, or there may be an intermediate layer, an intermediate area, or an intermediate component.

In order to be clear, thickness of areas and layers have been enlarged in the drawings. For example, in order to facilitate the description, thicknesses and sizes of the components are arbitrarily shown. Therefore, the technical scope of the described techniques is not limited by the drawings.

In the following text, in one or more exemplary embodiments, axis X, axis Y and axis Z are not limited to the three axes in the rectangular coordinate system, but can be also interpreted as a broad meaning including three axes. For example, axis X, axis Y and axis Z can be perpendicular to each other, or can represent different directions which are not perpendicular to each other.

In addition, it should also be noted that, in some alternative implementations, all the methods described in this specification can be performed out of order. For example, two consecutive steps that are shown can actually be performed simultaneously, or sometimes in reverse order.

As used herein, the expression "and/or" includes any one and all combinations of relevant items listed. When an expression "at least one of . . . " is located in front of a list of elements, the expression means to define the entire list, but not to define a single element in the list. In this invention, the expression "approximately" includes meanings of "completely", "almost completely" and "to any significant degree" in some application situations or according to the person skilled in the art. Besides, the expression "connected with . . . " can also mean "electrically connected with . . . ".

To be clear, a same component in different figures is referred by a same reference sign.

The embodiments of the present invention are illustrated in details as follows with reference to the drawings.

FIG. 1 illustrates a schematic diagram of a flexible touch sensor according to an embodiment of the present invention. As shown in FIG. 1, the flexible touch sensor includes a plurality of first touch electrodes 101 extending along a first direction x, and a plurality of second touch electrodes 102 extending along a second direction y. The first direction x and the second direction y intersect with each other. The flexible touch sensor includes a foldable area FA and a non-foldable area NFA. A third touch electrode 103 is placed in the foldable area FA, the first touch electrode 101 is placed in the non-foldable area NFA, and the third touch electrode 103 does not overlap a portion of the second touch electrode 102 in the foldable area FA. The flexible touch sensor further includes an insulation layer 104 placed in the non-foldable area NFA. The first touch electrode 101 is insulated from the second touch electrode 102 by the insulation layer 104.

The flexible touch sensor provided by this embodiment of the present invention is flexible, and is capable of bending, folding or rolling. The flexible touch sensor includes a foldable area FA and a non-foldable area NFA. The foldable area FA is an area within a dashed frame shown in FIG. 1, and the non-foldable area NFA is an area outside the dashed frame. The flexible touch sensor is foldable or bendable in the foldable area FA. It should be noted that, the division of the foldable area FA and the non-foldable area NFA are merely for better illustrating configuration of the flexible touch sensor, but does not mean that the flexible touch sensor does not has flexibility and cannot be folded in the non-foldable area NFA. That is, the non-foldable area NFA of the flexible touch sensor can be flexible or rigid, which is not limited in the present invention. The foldable area is foldable. In one embodiment, the foldable area FA can be a strip-like area. The flexible touch sensor can be folded in half along an extending direction of the strip-like area as an axis. When the flexible touch sensor has good flexibility and is foldable with a small curvature radius, a width of the foldable area in a direction perpendicular to the extending direction of the strip-like area can be relatively small; when the flexible touch sensor has a great bending curvature radius, the width of the foldable area in the direction perpendicular to the extending direction of the strip-like area can be relatively great, depending on different situations. The strip-like area can extend through the flexible touch sensor along its extending direction, or only extends through a part of the flexible touch sensor corresponding to a display area of the display panel. The extending direction of the strip-like area can be the first direction. In order to further improve the flexibility of the flexible touch sensor, the first touch electrode 101, the second touch electrode 102 and the third touch electrode 103 can be formed as metal grid.

The flexible touch sensor provided by the embodiments of the present invention can achieve function of detecting a touch position, and such function can be realized by a mutual capacitance touch or a self-capacitance touch.

The mutual capacitance touch includes a touch driving electrode and a touch detecting electrode. A touch driving signal is sequentially input into the touch driving electrode, and the touch detecting electrode outputs a detecting signal. The touch driving electrode and the touch detecting electrode form a capacitor, and when touch happens, the touch tool used, for example the finger, will influence coupling between the touch driving electrode and the touch detecting electrode near a touch point, and thus the capacitance between the touch driving electrode and the touch detecting electrode will be changed. A method for detecting location of the touch point includes: sequentially inputting the touch driving signals into the touch driving electrodes, and meantime outputting touch detecting signals by the touch detecting electrodes, so that the capacitance values at all the junctions of the touch driving electrodes and the touch detecting electrodes, i.e., capacitance values with coordinates all over the whole two-dimensional plane, can be obtained, and when one of these two-dimensional capacitance values changes, the position of the touch point can be determined according to the corresponding coordinates of the changed capacitance value.

As for the self-capacitance touch, the touch driving signal is input to a touch electrode, and the touch electrode and a ground form a capacitor. When touch happens, self-capacitance between the touch electrode and the ground near the touch point will change, and meantime the touch electrode outputs a touch detecting signal, such that location of the touch electrode whose capacitance changes can be determined, thereby determining the position where the touch happens.

The touch detecting mode in the embodiments of the present invention can be a mutual capacitance touch, a self-capacitance touch, or a mixed touch mode of a mutual capacitance touch and a self-capacitance touch. The first touch electrode 101 extends along the first direction x, the second touch electrode 102 extends along the second direction y, and the first direction x and the second direction y intersect with each other. Thus, the first touch electrode 101 and the second touch electrode 102 partially overlap, while the first touch electrode 101 is kept insulated from the second touch electrode 102 by the insulation layer 104. Herein, each of the first touch electrode 101 and the second touch electrode 102 can be a self-capacitance electrode in the self-capacitance touch mode, or the first touch electrode 101 and the second touch electrode 102 are respectively the touch driving electrode and the touch detecting electrode in the mutual capacitance detecting mode.

The flexible touch sensor in the embodiments of the present invention further includes a third touch electrode 103 located in the foldable area FA. The second touch electrode is an electrode extending along the second direction y, and the second touch electrode extends through the foldable area. The insulation layer 104 is only placed in the non-foldable area NFA. The third touch electrode 103 does not overlap with the portion of the second touch electrode 102 in the foldable area FA, and thus the third touch electrode can be a block-like electrode. In the embodiments of the present invention, since the first touch electrode is placed in the non-foldable area, and the third touch electrode is placed in the foldable area, the first touch electrode can have a different touch mode or a different electrical connecting mode from the third touch electrode. In addition, the third touch electrode does not overlap with the portion of the second touch electrode in the foldable area, and thus the insulation layer of the flexible touch sensor can be placed only in the non-foldable area. It can be understood that, a thickness of the organic insulation layer is generally 4-5 times a thickness of the inorganic insulation layer. In order to realize weight reduction and thinning of the flexible touch sensor, the insulation layers in the touch sensor for insulating the different metal layers are generally made of inorganic layers. However, the inorganic layer has high fragility, and easily cracks when being bent, and the cracks expand longitudinally, which may easily draw the touch electrode to break, causing touch failure. In the embodiments of the present invention, the touch electrode is regionalized, no insulation layer is placed in the foldable area, which, compared with the technical solution of providing an organic insulation layer in the foldable area, greatly reduces the thickness of the film layers of the foldable area, improves the bending performance, reduces the bending curvature radius, and achieves better folding effect. Compared with the technical solution of providing an inorganic insulation layer in the foldable area, since no inorganic insulation layer is placed in the foldable area, the bending stability of the touch electrode is improved, and thus the flexible touch sensor can have good touch performance even after repeatedly bending.

In the non-foldable area, the insulation layer 104 can be planar, that is, the insulation layer 104 is shaped as an undivided planar structure in the non-foldable area, and needs no patterning.

In the embodiments of the present invention, the third touch electrode 103 can have various touch modes and various electrical connecting modes, which will be described in detail as follows.

The third touch electrode 103 can be a self-capacitance touch electrode, at this time, each third touch electrode 103 and the ground form a capacitor, so that the touch positions are detected, respectively. Each third touch electrode is independently wired without bridging connection, the third touch electrodes 103 can be placed in the gaps between the second touch electrodes in the foldable area and do not overlap with the second touch electrodes so as to be insulated from the second touch electrodes, and the insulation layer 104 can be placed only in the non-display area. The first touch electrodes 101 are insulated from and intersect with the second touch electrodes 102 in the non-foldable area NFA by the insulation layer 104. Either the first touch electrodes or the second touch electrodes can be mutual capacitance electrodes or self-capacitance electrodes.

In another implementation of the present invention, the flexible touch sensor is a mutual capacitance touch sensor, both the first touch electrode 101 and the third touch electrode 103 are one of a touch driving electrode and a touch detecting electrode, and the second touch electrode 102 is the other one of the touch driving electrode and the touch detecting electrode. Compared with self-capacitance touch sensor, the mutual capacitance touch sensor has an advantage in realizing real multi-point touch detection, and the first touch electrode 101 and the second touch electrode 102 form a capacitor therebetween. In one embodiment, in the foldable area FA, the third touch electrode and the second touch electrode which extends through the foldable area form a capacitor therebetween, at this time, both the first touch electrode and the third touch electrode are touch driving electrodes or touch detecting electrodes. In order to accurately detect a touch position in the foldable area and reduce the number of the touch signal lines, the third touch electrodes distributed in the foldable area can be regularly arranged and electrically connected.

In one embodiment, the flexible touch sensor includes a plurality of third touch electrodes 103 located in the foldable area FA, the second touch electrodes are electrodes extending along the second direction y, the second touch electrodes pass through the foldable area, the insulation layers 104 are placed only in the non-foldable area NFA, and the third touch electrodes 103 do not overlap with the portion of the second touch electrodes 102 in the foldable area FA. Thus, the third touch electrodes can be block-like electrodes, the plurality of third touch electrodes 103 can be arranged in at least one row in a direction that can be the same as the first direction, and each third touch electrode is placed between two adjacent second touch electrodes 102. Under such arrangement, the third touch electrodes are evenly distributed in the foldable area, such that substantially a same initial capacitance can be formed between each third touch electrode 103 and each second touch electrode, thereby achieving desired precision of the touch detection.

Figure 2A:
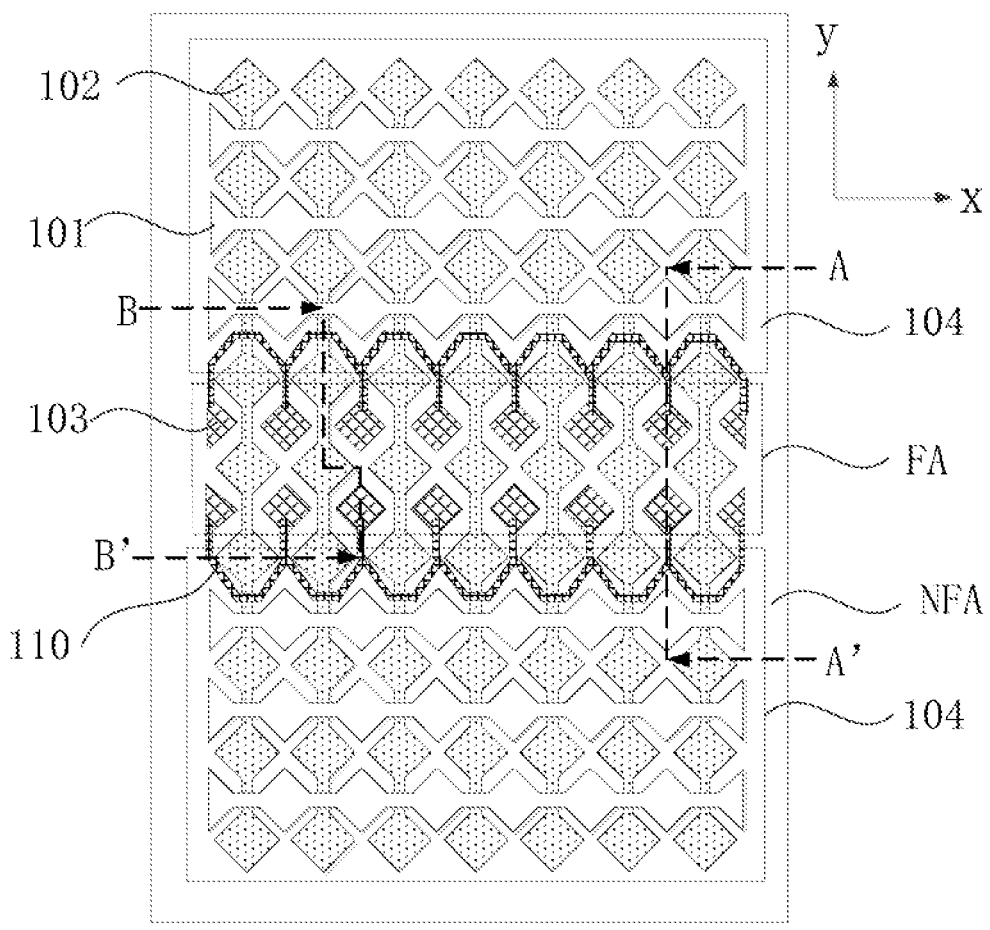
FIG. 2A illustrates a schematic diagram of a flexible touch sensor according to another embodiment of the present invention.
Figure 2B:
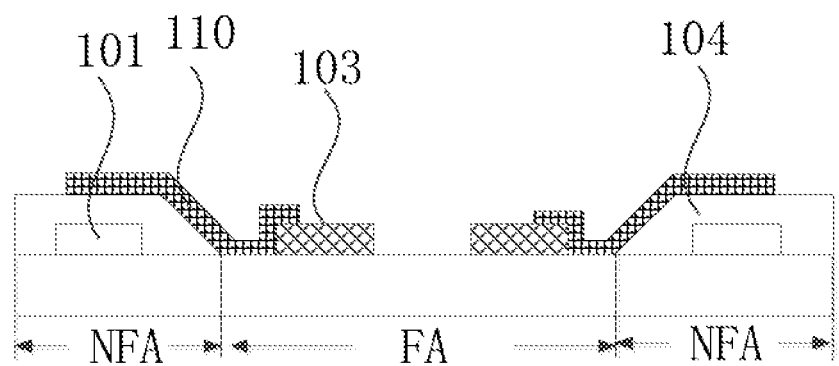
FIG. 2B illustrates a cross-sectional view along AA' in FIG. 2A.
Figure 2C:
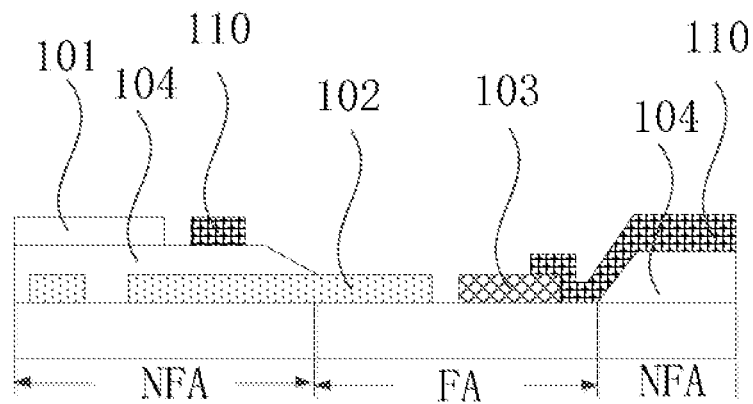
FIG. 2C illustrates a cross-sectional view along BB' in FIG. 2A.

FIG. 2A illustrates a schematic diagram of a flexible touch sensor according to another embodiment of the present invention, FIG. 2B illustrates a cross-sectional view along AA' in FIG. 2A, and FIG. 2C illustrates a cross-sectional view along BB' in FIG. 2A. As shown in FIG. 2A and FIG. 2B, the plurality of the third touch electrodes in the foldable area FA is arranged in at least one row along the first direction x, and adjacent third touch electrodes 103 in a same row are electrically connected with each other by a first bridge 110. The row direction is the same as the first direction x and intersects with the second direction y. In order to insulate the third touch electrodes 103 from the second touch electrodes 102, the first bridge 110 extends to the non-foldable area NFA, and is insulated from the second touch electrodes 102 by the insulation layer 104 in the non-foldable area. In the technical solution of this embodiment, the plurality of third touch electrodes in one row are electrically connected with one another by the first bridge 110 in the row direction so as to form one touch electrode, so that, the plurality of third touch electrodes electrically connected with one another is equivalent to one first touch electrode in realization of touch function. The third touch electrode 103 and the second touch electrode 102 can form a capacitor therebetween, and the first touch electrode 101 and the second touch electrode 102 can also form a capacitor therebetween, thereby realizing touch detection uniformity of the whole touch sensor. In addition, the first bridge 110 connecting adjacent third touch electrodes 103 extends to the non-foldable area, and the insulation layer 104 in the non-foldable area NFA insulates the third touch electrodes 103 from the second touch electrodes 102, thereby realizing normal touch function. Since there is no insulation layer 104 in the foldable area FA, the flexible touch sensor can have a small stacking thickness of the film layers in the foldable area; besides, no inorganic insulation layer is placed in the foldable area, the phenomenon that the bending cracks of the insulation layer draw the touch sensor to break will not happen when the foldable area of the flexible touch sensor is being folded, thereby ensuring bending stability of the flexible touch sensor.

With reference to FIG. 2C, in the non-foldable area NFA, the flexible touch sensor further includes a first metal layer and a second metal layer, and the insulation layer 104 is located between the first metal layer and the second metal layer. In FIG. 2C, the film layer where the first touch electrodes are located can be the first metal layer. The second touch electrodes 102 and the third touch electrodes 103 are placed in a same layer. The film layer where the second touch electrodes 102 and the third touch electrodes 103 are located can be the second metal layer. The first bridge 110 and the first metal layer are placed in a same layer. Accordingly, the first bridge 110 and the first metal layer can be formed in a same technical process, and no additional process step is needed. The first bridge 110 electrically connects the third touch electrodes located in the foldable area into one row by the first metal layer in the non-folding area, meantime, the insulation layer in the non-foldable area insulates the third touch electrodes from the second touch electrodes, thereby forming a capacitor between the third touch electrodes and the second touch electrodes.

The first touch electrodes are located in one of the first metal layer and the second metal layer, and the second touch electrode is located in the other one of the first metal layer and the second metal layer.

In the implementation shown in FIG. 2C, the first touch electrodes 101 are placed in the first metal layer, and the second touch electrodes 102 are placed in the second metal layer. At this time, the first touch electrodes and the second touch electrodes can be strip-like electrodes.

Figure 3A:
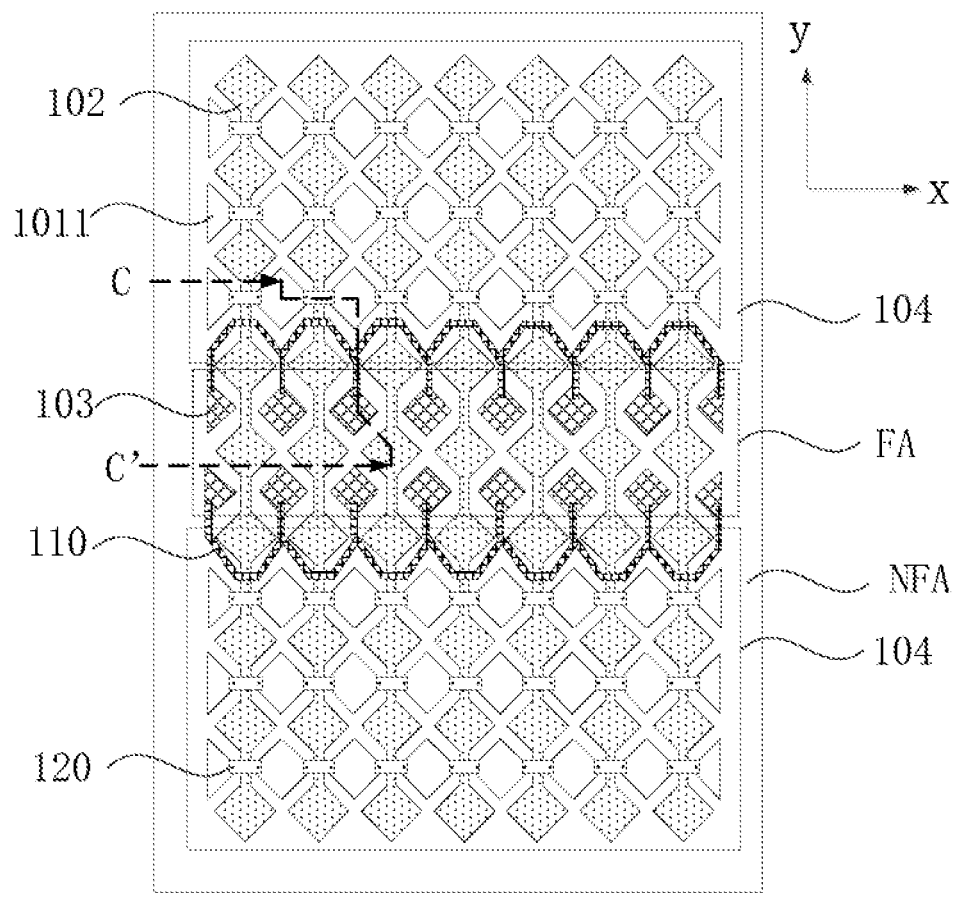
FIG. 3A illustrates a schematic diagram of a flexible touch sensor according to still another embodiment of the present invention.
Figure 3B:
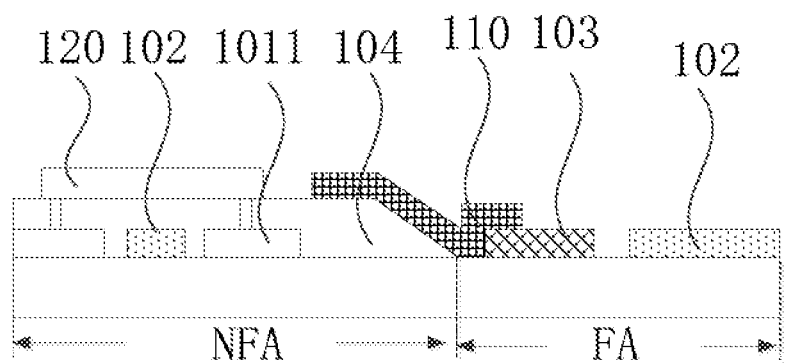
FIG. 3B illustrates a cross-sectional view along CC' in FIG. 3A.

FIG. 3A illustrates a flexible touch sensor according to still another embodiment of the present invention. FIG. 3B illustrates a cross-sectional view along CC' in FIG. 3A. With reference to FIG. 3A and FIG. 3B, each first touch electrode 101 includes a plurality of first touch sub-electrodes 1011, the first touch sub-electrodes 1011 and the second touch electrodes 102 are placed in a same layer, and the first touch sub-electrodes 1011 are electrically connected with each other by a second bridge 120.

The first touch sub-electrodes 1011 and the second touch electrodes 102 are located in one of the first metal layer and the second metal layer, and the second bridge 120 is located in the other one of the first metal layer and the second metal layer;

The plurality of first touch sub-electrodes 1011 of the first touch electrode 101 is electrically connected with each other by the second bridge 120.

In the present implementation, the first touch electrode includes a plurality of first touch sub-electrodes 1011, and the plurality of first touch sub-electrodes is electrically connected with each other by the bridge 120 so as to form the first touch electrode. The plurality of first touch sub-electrodes 1011, the second touch electrodes 102 and the third touch electrodes 103 can be placed in a same layer, and all the touch electrodes are made in one technical process. The second bridge 120 connecting the first touch sub-electrodes 1011 and the first bridge 110 connecting the third touch sub-electrodes 103 are placed in a same layer, the second bridge 120 passes through a through hole in the insulation layer 104 to connect the first touch sub-electrodes, the first bridge 110 is electrically connected with the third touch sub-electrodes by directly contacting the third touch sub-electrodes in the foldable area FA, the first bridge 110 extends onto the insulation layer 104 in the non-foldable area, and the second touch electrodes 120 are insulated from the first bridge 110 by the insulation layer 104, thereby forming capacitors between the first touch electrodes and the second touch electrodes, and between the third touch electrodes and the second touch electrodes. In addition, no insulation layer 104 is placed in the foldable area FA, so that the folding stability of the foldable area of the flexible touch sensor is improved.

In one embodiment, as shown in FIG. 2B and FIG. 3B, the insulation layer 104 is placed only in the non-foldable area. At the junction of the non-foldable area and the foldable area, when the first bridge 110 extends from the non-foldable area NFA to the foldable area FA, the first bridge 110 extends downwards from an upper surface of the insulation layer 104; in order to avoid breaking of the first bridge at the junction of the non-foldable area and the foldable area due to thickness difference of the inorganic layer, a portion of the insulation layer 104 close to the foldable area can have a decreasing thickness, and the thickness of such portion can gradually decrease to 0. Under such arrangement, breaking of wiring at the junction of the non-foldable area and the foldable area due to the segment difference of the inorganic layer can also be avoided.

Figure 4A:
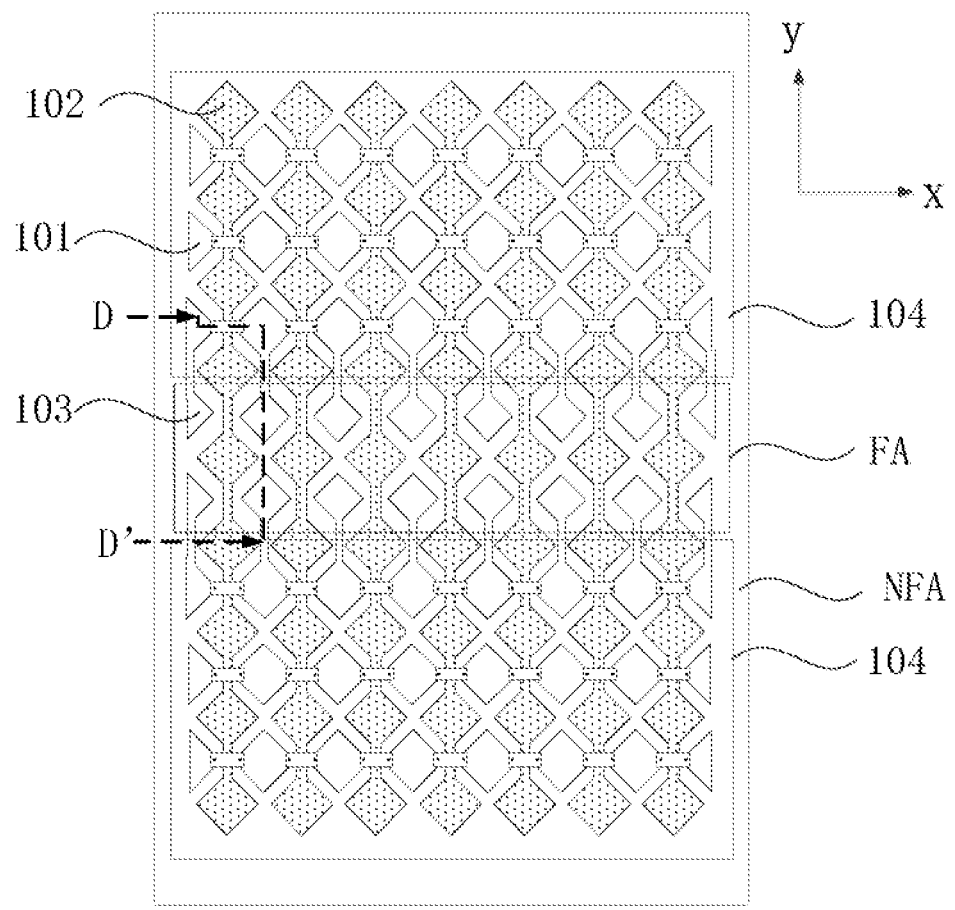
FIG. 4A illustrates a schematic diagram of a flexible touch sensor according to still another embodiment of the present invention.
Figure 4B:
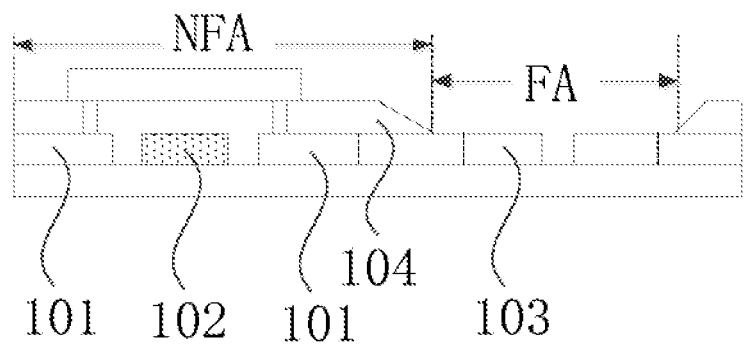
FIG. 4B illustrates a cross-sectional view along DD' in FIG. 4A.

FIG. 4A illustrates a schematic diagram of a flexible touch sensor according to still another embodiment of the present invention. FIG. 4B illustrates a cross-sectional view along DD' in FIG. 4A. As shown in FIG. 4A and FIG. 4B, the first touch electrode 101 extends along a first direction x, the second touch electrode 102 extends along a second direction y, and the first direction x intersects with the second direction y. The flexible touch sensor includes a foldable area FA and a non-foldable area NFA. A third touch electrode 103 is placed in the foldable area FA. The first touch electrode 101 is placed in the non-foldable area NFA. The third touch electrode 103 does not overlap a portion of the second touch electrode 102 in the foldable area FA. The insulation layer 104 is placed in the non-foldable area NFA, and the insulation layer 104 insulates the first touch electrode 101 from the second touch electrode 102. The third touch electrode 103 is electrically connected with adjacent first touch electrodes 101.

In this embodiment, the third touch electrode 103 is placed in the foldable area FA, the second touch electrode extends along the second direction y, the second touch electrode extends through the foldable area, and the insulation layer 104 is placed only in the non-foldable area NFA. In addition, the third touch electrode 103 does not overlap the portion of the second touch electrode 102 in the foldable area FA, therefore, the third touch electrode can be formed as a block-like electrode. In order to realize detection of the touch position in the foldable area, the third touch electrode in the non-foldable area can be electrically connected with the first touch electrode 101 in the foldable area NFA. FIG. 4A and FIG. 4B show that the third touch electrode 103 and the first touch electrode 101 are formed in a same layer, and the first touch electrode 101 and the third touch electrode 103 electrically connected with the first touch electrode 101 are integrally formed. It should be noted, such arrangement is merely exemplary, and other arrangement is also applicable as long as the third touch electrode can be electrically connected with adjacent first touch electrodes 101. Under such arrangement, the third touch electrode and the first touch electrode electrically connected with the third touch electrode as a whole can function as a touch electrode for detection of touch position. The third touch electrode in the foldable area is electrically connected with the first touch electrode 101 so that capacitor can be formed between the third touch electrode and the second touch electrode 102. Or, the first touch electrode and the third touch electrode electrically connected with the first touch electrode together function as one touch electrode of the self-capacitance detecting mode, so that the insulation layer is omitted in the foldable area FA while normally realizing the touch detection function of the foldable area. Therefore, it is realized that the insulation layer 104 is provided only in the non-foldable area, which reduces the thickness of the touch structures stacked in the foldable area, and eliminates the necessity of providing an insulation layer in the foldable area during normal realization of the conventional touch function, thereby improving bending performance of the flexible touch sensor, reducing or avoiding cracks of the inorganic layer due to bending, and preventing breaking of the touch electrodes or touch wirings.

In one embodiment, the third touch electrodes 103 in the foldable area are arranged in at least one row in the first direction x, and the third touch electrodes 103 arranged in a same row are electrically connected with one same first touch electrode 101, such that the third touch electrodes in the same row can have identical touch signals, and cooperate with the second touch electrode 102 extending along the second direction to determine the touch position in the self-capacitance detecting mode or the mutual capacitance detecting mode.

In one embodiment, the third touch electrodes can be arranged in a plurality of rows, and FIG. 4A shows that the third touch electrodes are arranged in two rows, and the third touch electrodes 103 in a same row are electrically connected with a same first touch electrode 101. As for the two rows of third touch electrodes, the third touch electrodes 103 in an upper row are electrically connected with the first touch electrode 101 at an upper end of the foldable area FA, and the third touch electrodes 103 in an lower row is electrically connected with the first touch electrode 101 at a lower end of the foldable area FA, such that each third touch electrode can be electrically connected with closest first touch electrode 101 to form one touch electrode which cooperates with the second touch electrodes to realize detection of touch position. Under such implementation, the touch electrode formed by the first touch electrode 101 and the third touch electrode 103 electrically connected with the first touch electrode 101 has a small space between the two electrodes, thereby improving detection accuracy of the touch position, and facilitating connection between the third touch electrode 103 and the first touch electrode 101.

Figure 5:
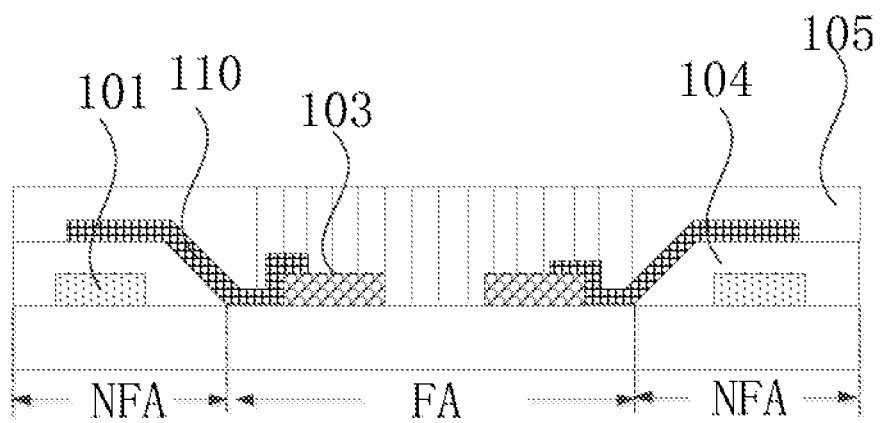
FIG. 5 illustrates a cross-sectional view of a flexible touch sensor according to still another embodiment of the present invention.

In one embodiment, FIG. 5 illustrates a cross-sectional view of a flexible touch sensor according to still another embodiment of the present invention. As shown in FIG. 5, based on the implementation described above, the flexible touch sensor is further covered by a planarization organic film 105. Since the insulation layer 104 is placed only in the non-foldable area NFA, a thickness of the foldable area of the flexible touch sensor is smaller than the thickness of the non-foldable area, which is adverse to planarization of the flexible touch sensor. The planarization organic film 105 can make the flexible touch sensor planar with a flat surface, such that the flexible touch sensor has an approximately identical thickness in the foldable area and the non-foldable area, and the planarization organic film in the foldable area is thicker than the planarization organic film in the non-foldable area. As the organic film has good stress relieving effect, the bending performance of the foldable area of the flexible touch sensor is improved. Besides, the planarization organic film 105 can also help to protect the flexible touch sensor.

In one embodiment, the planarization organic film in the foldable area can be divided. As shown in FIG. 5, the planarization organic film in the foldable area FA is divided into a plurality of strip-like structures along a thickness direction of the flexible touch sensor, such that the planarization organic film divided can further dissipate the stress when the flexible touch sensor is being bent along a downward direction in FIG. 5, and alleviates the stretching stress applied onto the touch electrode due to bending, thereby improving the bending performance of the flexible touch sensor.

Figure 6:
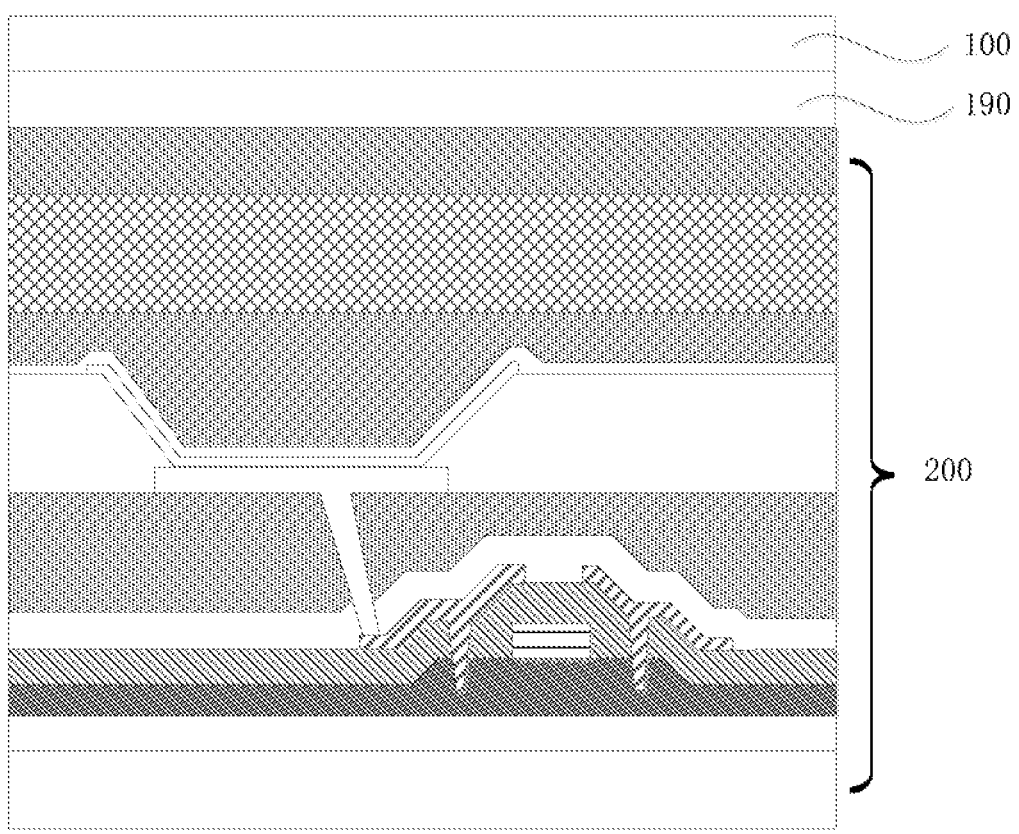
FIG. 6 illustrates a schematic diagram of a flexible touch display panel according to still another embodiment of the present invention.

The present invention further provides a flexible touch display panel including any one of the flexible touch sensors 100 as described above. FIG. 6 illustrates a schematic diagram of a flexible touch display panel according to an embodiment of the present invention. As shown in FIG. 6, the flexible touch display panel includes a flexible display panel 200. The flexible display panel can be a flexible liquid crystal display panel, or a flexible organic light-emitting display panel. Whatever the flexible display panel is, the flexible display panel has display function that can display images, and has flexibility. The flexible touch sensor as described in any implementation above is laminated with the flexible display panel by an adhesive layer 190, forming the flexible touch display panel with touch function. The flexible touch sensor 100 is generally laminated on a side of the flexible display panel 200 that displays images, and the flexible touch sensor 100 includes a flexible transparent substrate. The flexible transparent substrate can be a flexible transparent polyimide thin-film substrate. The first touch electrode, the second touch electrode and the third touch electrode are placed on the flexible transparent substrate. According to an implementation, the flexible touch display panel is formed by laminating the flexible touch sensor and the flexible display panel. The thickness and bending performance of the flexible touch sensor 100 are important for the entire flexible touch display panel. By providing the third touch electrode in the foldable area of the flexible touch sensor 100, the insulation layer is eliminated from the foldable area, and thus the thickness of the foldable area of the flexible touch sensor 100 is reduced, such that peeling risk of the flexible touch sensor 100 and the flexible display panel 200 during bending of the flexible touch display panel in the foldable area is reduced.

Figure 7:
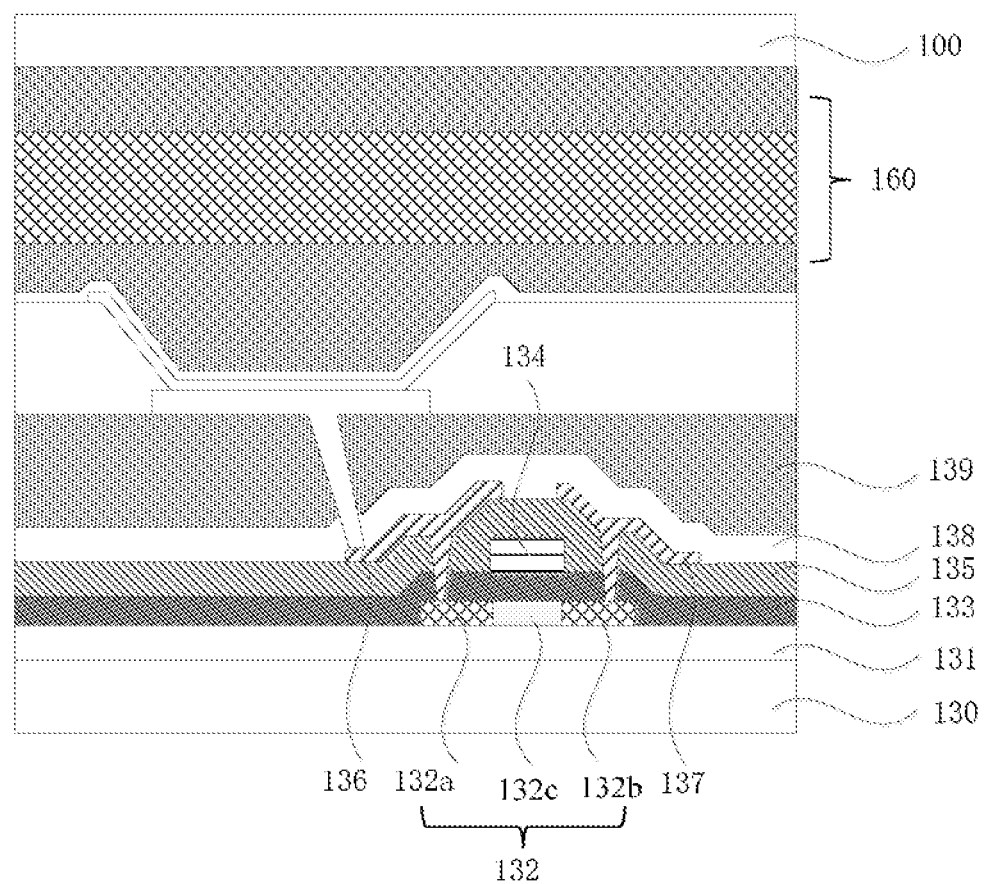
FIG. 7 illustrates a schematic diagram of a flexible touch display panel according to still another embodiment of the present invention.

FIG. 7 illustrates a schematic diagram of a flexible touch display panel according to still another embodiment of the present invention. As shown in FIG. 7, the flexible touch display panel includes a flexible substrate 130, a thin-film transistor array formed on the flexible substrate 130, and an organic light-emitting layer formed on the thin-film transistor array. The thin-film transistors can constitute a pixel circuit for controlling a display pixel to emit light. The organic light-emitting layer includes a plurality of light-emitting units, and each light-emitting unit can emit light with a different color from some other light-emitting units. Each light-emitting unit and the pixel circuit form a display pixel, the plurality of display pixels cooperatively displays images. An organic light-emitting diode display panel further includes a thin-film encapsulation layer 160 for sealing the organic light-emitting layer. The thin-film encapsulation layer generally includes at least one inorganic layer, for preventing external moisture and oxygen from entering the organic light-emitting layer and then avoiding failure of the organic light-emitting layer. The thin-film encapsulation layer can further include an organic layer cooperating with the inorganic layer to form an inorganic-organic-inorganic layer stack structure, thereby further improving barrier effect of the thin-film encapsulation layer from moisture and oxygen. FIG. 7 merely shows one light-emitting unit and one thin-film transistor structure.

According to an embodiment of the present invention, the flexible substrate may be made of polymers such as polyimide (PI), polycarbonate (PC), polyether sulphone (PES), polyethylene terephthalate (PET), polyethylene naphthalate (PEN), polyarylate (PAR), glass fiber reinforced plastics (FRP) and the like. The flexible substrate can be transparent, translucent, or opaque. The flexible substrate imparts the touch display panel with flexible display performance of bending, rolling and folding.

A buffer layer 131 is provided on the flexible substrate 130, and the butter layer 131 can cover the entire upper surface of the flexible substrate 130. According to an embodiment, the buffer layer includes an inorganic layer or an organic layer. For example, the buffer layer can be made of inorganic material such as silicon oxide (SiOx), silicon nitride (SiNx), silicon oxynitride (SiOxNy), aluminum oxide (AlOx), aluminum nitride (AlNx) and so on, or organic materials such as acryl, polyimide (PI), polyester, and so on. The buffer layer 131 can be formed in a single layer or in a plurality of layers. The buffer layer blocks oxygen and moisture, prevents the moisture or impurities from diffusing through the flexible substrate, and provides a flat surface on the upper surface of the flexible substrate 130.

The thin-film transistors TFT are located on the buffer layer 131. In an embodiment of the present invention, the thin-film transistor of a top gate type is taken for example for illustration.

The thin-film transistor TFT includes a semiconductor active layer 132 located on the buffer layer 131, and the semiconductor active layer 132 includes a source electrode area 132a and a drain electrode area 132b formed by doping N-type impurity ions or P-type impurity ions. An area between a source electrode area 132a and a drain electrode area 132b is a channel area 132c without doped impurities.

The semiconductor active layer 132 can be formed by crystallizing amorphous silicon into polycrystalline silicon.

In order to crystallize the amorphous silicon, various methods can be adopted, for example, rapid thermal annealing (RTA) method, solid phase crystallization (SPC) method, excimer laser annealing (ELA) method, metal induced crystallization (MIC) method, metal induced lateral crystallization (MILC) method and sequential lateral solidification (SLS) method, etc.

A gate insulation layer 133 includes an inorganic layer made of silicon oxide, silicon nitride or metal oxide, the gate insulation layer 133 can include a single layer or a plurality of layers.

A gate electrode 134 is placed in a specific area on the gate insulation layer 133. The gate electrode 134 can include one or more layers made of gold (Au), silver (Ag), copper (Cu), nickel (Ni), platinum (Pt), palladium (Pd), aluminum (Al), molybdenum (Mo) or chromium (Cr), or alloys such as aluminum (Al): neodymium (Nd) alloy, molybdenum (Mo): tungsten (W) alloy.

An interlayer insulation layer 135 is placed on the gate electrode 134. The interlayer insulation layer 135 can be an insulation inorganic layer made of silicon oxide or silicon nitride. Alternatively, the interlayer insulation layer can be formed by an insulating organic layer.

A source electrode 136 and a drain electrode 137 are placed on the interlayer insulation layer 135. The source electrode 136 is electrically connected with (or bonded to) the source electrode area through a contact hole, and the drain electrode 137 is electrically connected with (or bind to) the drain electrode area through another contact hole. The contact holes are formed by selectively removing a portion of the gate insulation layer and a portion of the interlayer insulation layer.

A passivation layer 138 is placed on the source electrode and the drain electrode. The passivation layer 138 can be an inorganic layer made of silicon oxide or silicon nitride, or an organic layer.

A planarization layer 139 is placed on the passivation layer 138. The planarization layer 139 includes an organic layer made of acrylic, polyimide (PI) or benzocyclobutene (BCB), and the planarization layer 139 has planarization function.

An organic light-emitting element is formed on the thin-film transistor TFT.

A thin-film encapsulation layer is placed on the organic light-emitting element. In an embodiment, the thin-film encapsulation layer protects the light-emitting layer and other thin layers from external influence of moisture and oxygen, etc.

The flexible touch sensor can be directly formed on the surface of the thin-film encapsulation layer. In embodiments of the present invention, the third touch electrode 103 is provided in the foldable area, and the insulation layer 104 can be placed only in the non-foldable area, such that there may be no compact stack structure of two inorganic layers formed in the foldable area. Herein, the two inorganic layers refer to the outermost inorganic layer of the thin-film encapsulation layer and the inorganic insulation layer of the flexible touch sensor. A compact stack of inorganic layers increase stress accumulation between the inorganic layers, causing poor bending performance. However, in the embodiments of the present invention, the thickness of the foldable area of the flexible touch display panel is reduced, and at the same time avoids stacking of the insulation inorganic layer of the flexible touch sensor and the encapsulation inorganic layer, thereby reducing accumulation of bending stress, and improving bending performance.

The above are merely several embodiments of the present invention, which, as mentioned above, are not used to limit the present invention, and are not exclusive. For those skilled in the art, the present invention can have a variety of modifications and changes without depart the invention concept of the present invention. Whatever in the principles of the present invention, including any modification, equivalent substitution, improvement, etc., shall all fall into the protection scope of the present invention.

What is claimed is:

1. A flexible touch sensor, comprising:
   a foldable area and a non-foldable area;
   a plurality of first touch electrodes placed in the non-foldable area, extending along a first direction;
   a plurality of second touch electrodes, a part of which is placed in the foldable area, a remaining part of which is placed in the non-foldable area, wherein the plurality of second touch electrodes extends along a second direction, wherein the first direction intersects with the second direction;
   a plurality of third touch electrodes placed in the foldable area, not overlapping the part of the plurality of second touch electrodes placed in the foldable area;
   an insulation layer placed in the non-foldable area, wherein the plurality of first touch electrodes are insulated from the plurality of second touch electrodes by the insulation layer; and
   a plurality of first bridges, wherein one of the plurality of first bridges extends from the foldable area to the non-foldable area and then extends back to the foldable area from the non-foldable area in such a manner that said first bridge connects two adjacent third touch electrodes of the plurality of third touch electrodes in a same row;
   wherein the plurality of first bridges is insulated from the plurality of second touch electrodes by the insulation layer in the non-foldable area;

wherein the plurality of third touch electrodes are arranged in at least one row along the first direction; and wherein each of the plurality of third touch electrodes is located between two adjacent second touch electrodes of the plurality of second touch electrodes.

2. The flexible touch sensor according to claim 1, wherein the foldable area is a strip-like area.

3. The flexible touch sensor according to claim 1, wherein the plurality of first bridges and the plurality of first touch electrodes are placed in a same layer, and wherein the plurality of third touch electrodes and the plurality of second touch electrodes are placed in a same layer.

4. The flexible touch sensor according to claim 1, further comprising a plurality of second bridges, wherein the plurality of first touch electrodes each comprises a plurality of first touch sub-electrodes, wherein the plurality of first touch sub-electrodes and the plurality of second touch electrodes are placed in a same layer, and wherein the plurality of first touch sub-electrodes are electrically connected with one another by the plurality of second bridges; and wherein the plurality of second bridges and the plurality of first bridges are placed in a same layer.

5. The flexible touch sensor according to claim 1, wherein the flexible touch sensor is a mutual capacitance touch sensor, wherein one of the plurality of first touch electrodes or one of the plurality of third touch electrodes is either a touch driving electrode or a touch detecting electrode, and one of the plurality of second touch electrodes is the other one of the touch driving electrode and the touch detecting electrode.

6. The flexible touch sensor according to claim 1, wherein one of the plurality of first touch electrodes or one of the plurality of second touch electrodes is a mutual capacitance touch electrode, and one of the plurality of third touch electrode is a self-capacitance touch electrode.

7. The flexible touch sensor according to claim 1, wherein the insulation layer in the non-foldable area is planar.

8. The flexible touch sensor according to claim 1, wherein a portion of the insulation layer next to the foldable area has a gradually decreasing thickness toward the foldable area.

9. The flexible touch sensor according to claim 8, wherein the gradually decreasing thickness of the portion of the insulation layer gradually decreases to none.

10. The flexible touch sensor according to claim 1, wherein each one of the touch electrodes among the plurality of first touch electrodes, the plurality of second touch electrodes and the plurality of third touch electrode is formed as a metal grid.

11. The flexible touch sensor according to claim 1, further comprising a planarization organic film, wherein the planarization organic film is divided in the foldable area.

12. A flexible touch display panel, comprising a flexible touch sensor, wherein the flexible touch sensor comprises:
a foldable area and a non-foldable area;
a plurality of first touch electrodes placed in the non-foldable area, extending along a first direction;
a plurality of second touch electrodes, a part of which is placed in the foldable area, the remaining part of which is placed in the non-foldable area, extending along a second direction, wherein the first direction intersects with the second direction;
a plurality of third touch electrodes placed in the foldable area, not overlapping the part of the plurality of second touch electrodes placed in the foldable area;
an insulation layer placed in the non-foldable area, wherein the plurality of first touch electrodes are insulated from the plurality of second touch electrodes by the insulation layer; and
a plurality of first bridges, wherein one of the plurality of first bridges extends from the foldable area to the non-foldable area and then extends back to the foldable area from the non-foldable area in such a manner that said first bridge connects two adjacent third touch electrodes of the plurality of third touch electrodes in a same row;
wherein the plurality of first bridges is insulated from the plurality of second touch electrodes by the insulation layer in the non-foldable area;
wherein the plurality of third touch electrodes are arranged in at least one row along the first direction; and
wherein each of the plurality of third touch electrodes is located between two adjacent second touch electrodes of the plurality of second touch electrodes.

13. The flexible touch display panel according to claim 12, further comprising a flexible display panel; wherein the flexible touch sensor comprises a flexible transparent substrate, and the flexible touch sensor is laminated on the flexible display panel.

14. The flexible touch display panel according to claim 12, further comprising:
a flexible substrate;
a thin-film transistor array;
an organic light-emitting layer; and
a thin-film encapsulation layer;
wherein the thin-film transistor array, the organic light-emitting layer and the thin-film encapsulation layer are successively formed on the flexible substrate; and
wherein the flexible touch sensor is directly formed on the thin-film encapsulation layer.

* * * * *